United States Patent [19]

Sugita

[11] Patent Number: 5,017,976
[45] Date of Patent: May 21, 1991

[54] SEMICONDUCTOR DEVICE HAVING INTERMEDIATE LAYER FOR PINCHING OFF CONDUCTIVE PATH DURING REVERSE BIAS APPLICATION

[75] Inventor: Naomasa Sugita, Yokohama, Japan
[73] Assignee: Kabushiki Kaisha Toshiba, Kawasaki, Japan
[21] Appl. No.: 443,333
[22] Filed: Nov. 30, 1989
[30] Foreign Application Priority Data
Dec. 2, 1988 [JP] Japan ................. 63-305767
[51] Int. Cl.$^5$ ........................... A01L 29/48
[52] U.S. Cl. ........................ 357/15; 357/52; 357/58; 357/22
[58] Field of Search ......... 357/15, 52, 52 D, 15 G, 357/15 P, 15 R, 58, 22

[56] References Cited

U.S. PATENT DOCUMENTS

| H40 | 4/1986 | Buchanan, Jr. et al. | 357/15 |
|---|---|---|---|
| 3,982,264 | 9/1976 | Ishitani | 357/22 |
| 4,134,123 | 1/1979 | Shannon | 357/15 |
| 4,641,174 | 2/1987 | Baliga | 357/58 |
| 4,796,069 | 1/1989 | Anantha et al. | 357/15 |
| 4,862,229 | 8/1989 | Mundy et al. | 357/15 |

FOREIGN PATENT DOCUMENTS

| 0103138 | 3/1984 | European Pat. Off. . |
|---|---|---|
| 0147893 | 7/1985 | European Pat. Off. . |
| 52-24465 | 2/1977 | Japan . |
| 53-20774 | 2/1978 | Japan . |
| 56-35473 | 4/1981 | Japan . |
| 56-37683 | 4/1981 | Japan . |
| 59-36264 | 3/1984 | Japan . |
| 59-143370 | 8/1984 | Japan . |
| 60-74582 | 4/1985 | Japan . |
| 1558506 | 1/1980 | United Kingdom . |
| 2176339 | 12/1986 | United Kingdom . |

OTHER PUBLICATIONS

Patent Abstracts of Japan, vol. 5, No. 91 (E-61) [763], p. 17 E 61, dated Jun. 13, 1981.

Primary Examiner—William Mintel
Attorney, Agent, or Firm—Finnegan, Henderson, Farabow, Garrett, and Dunner

[57] ABSTRACT

A semiconductor device comprising a semiconductor substrate having two major surfaces a cathode electrode film formed on the first major surface of the substrate, and an anode electrode film formed on the second major surface of the substrate. The substrate is formed of an N+-type layer formed on the cathode electrode film, an N−-type layer formed on the N+-type layer, and N−−-type layer formed on the N−-type layer and having an impurity concentration lower than that of the N−-type layer, and an N−-type layer interposed between the N−−-type layer and the anode electrode film. The device further comprises a plurality of P+-type areas formed in the second major surface of the substrate, contacting the anode electrode film and extending through the N−-type layer and the N−−-type layer into the N−-type layer. When a forward bias is applied to the device, a current flows from the anode electrode film, passes through the N−-, N−−-, N−- and the N+-type layers, and flows out of the cathode electrode film. When a reverse bias is applied to the device, the depletion layer formed around the junction between each P+-type area and the N−−-type layer extends, and joins with the similar depletion layers, thereby pinching off the current path. As a result, the reverse leakage current is reduced.

10 Claims, 5 Drawing Sheets

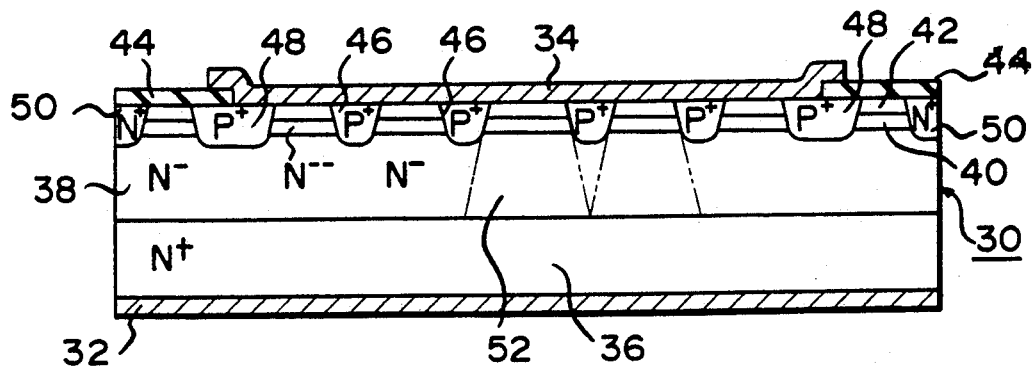
F I G. 5
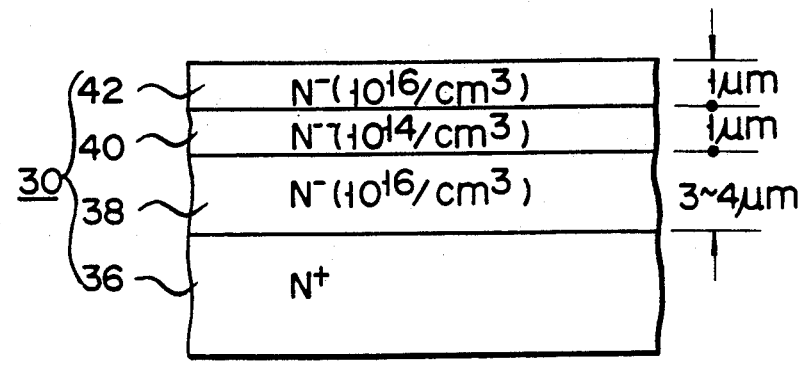
F I G. 6
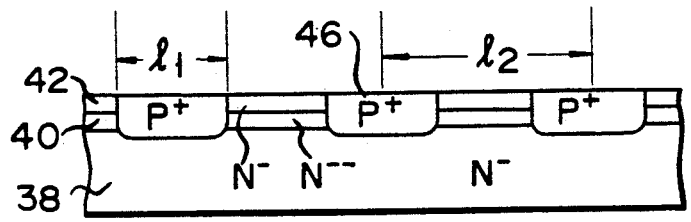
F I G. 7A
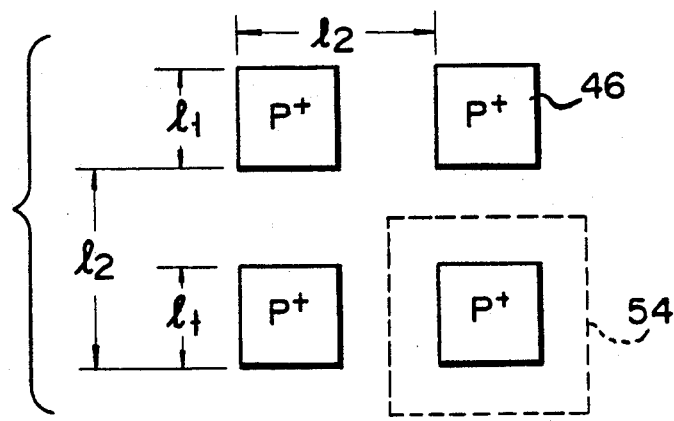
F I G. 7B

SEMICONDUCTOR DEVICE HAVING INTERMEDIATE LAYER FOR PINCHING OFF CONDUCTIVE PATH DURING REVERSE BIAS APPLICATION

BACKGROUND OF THE INVENTION

1. Field of the Invention

The present invention relates to a semiconductor device comprising a Schottky barrier diode wherein a PN junction is formed on a semiconductor layer located below a barrier metal film, and more particularly, to a semiconductor device having an intermediate semiconductor layer for pinching off a conductive path during the application of a reverse bias.

2. Description of the Related Art

Recently, most components of electronic apparatuses are ICs, and the power-supply devices incorporated in these apparatuses are generally of a switching regulator type, which are small and light and also operate with high efficiency. Most of the switching regulators have a Schottky Barrier Diode (SBD) rectifier used an output rectifying element. The SBD rectifier has a small forward voltage drop $V_F$ and a short reverse-recovery time. However, the SBJ rectifier now widely used is disadvantageous in two respects. First, a relatively large reverse leakage current often occurs, and second, the reverse breakdown voltage is low.

A new type of a SBD rectifier has been developed with a small reverse leakage current, and a high reverse breakdown voltage. (See Published Examined Japanese Patent Application No. 59-35183.) Such a rectifier is called a Junction Barrier-Controlled Rectifier Schottky (JBS). As is shown in FIG. 1, the substrate 10 of this JBS rectifier comprises an N+-type silicon layer 12, an N−-type silicon layer 14 formed on the layer 12 by means of epitaxial growth. Metal electrode film 16 is formed on the lower surface of the layer 12. A plurality of P+-type silicon areas 18 are formed in the upper surface of the layer 14. Oxide film 20, having an opening, is formed on the upper surface of the layer 14. Metal film 22, for example, chromium film, which forms a Schottky barrier, is formed partly on the exposed portion of the layer 14 and partly on the oxide film 20, as is illustrated in FIG. 1. The areas 18 are spaced apart from one another, by such a distance such that they are connected by an extending depletion layer 24 when a negative voltage is applied to the layer 16 and the film 22, respectively.

When a forward voltage is applied to the JBS rectifier shown in FIG. 1, most of a forward current flows through the Schottky barrier formed of the metal film 22 and the N−-type silicon layer 14, as is shown by arrows A. Hence, the forward voltage drop in this JBS rectifier is nearly equal to that in the ordinary Schottky diode which has no P+-type silicon areas.

A depletion layer 24 is formed around the PN junction comprised of the N−-type silicon layer 14 and the P+-type silicon area 18. As the reverse bias is increased, the depletion layer 24 connect to each other. The joined depletion layer 24 causes the reverse leakage current to decrease. As a result, the reverse-current characteristic of the JBS rectifier are similar to that of a PN junction diode, and the breakdown voltage of the JBS rectifier is improved.

If the reverse bias applied to the JBS rectifier is too low, depletion layers 24 are not connected to each other. Hence, the reverse leakage current, which flows through the Schottky barrier formed of the N−-type silicon layer 14 and the metal film 22, is not influenced. The improved reverse-current characteristic of the JBS rectifier are not achieved until the reverse bias increases such that the depletion layers 24 connect to each other.

FIG. 2 is a sectional view showing the JBS rectifier disclosed in Published Unexamined Japanese Patent Application No. 60-74582 and also in by B. J. Baliga, IEEE, Electron Device Letter, Vol. DEL-5, No. 6, 1984, pp. 194–196. As is shown in FIG. 2, wherein the same reference numerals are used to denote elements similar to those illustrated in FIG. 1, a plurality of PN junctions is formed in the surface of that portion of a semiconductor substrate 10 on which barrier metal film 2 is formed.

The semiconductor substrate 10 is made of an N+-type silicon layer 12 and an N−-type silicon layer 14. The barrier metal film 22 is made of aluminum. Generally, it is necessary to form a thin N+-type silicon layer in the surface of N−-type silicon layer 14 by means of ion implantation, thereby reducing the height of the Schottky barrier formed of N−-type silicon layer 14 and the metal film 22. In the JBS rectifier shown in FIG. 2, such a thin N+-type silicon layer is not formed since the film 22 is made of metal (ex. Ti, Mo, V) which has a low Schottky-barrier property. A plurality of P+-type silicon areas 18 are formed in the upper surface of a portion of the N−-type silicon layer 14. A guard ring 26 is formed on the layer 14, surrounding that portion of the layer 14. The guard ring 26 imparts an adequate breakdown voltage to the JBS rectifier.

When a forward bias is applied to the JBS rectifier, depletion layers 24 are formed, each being a PN junction between a P+-type silicon areas 18 and the N−-type silicon layer 14. The depletion layers 24 are not connected to one another when a forward bias is applied to the JBS rectifier. In other words, the depletion layers 24 are spaced apart by a gap 28 as is indicated by broken lines in FIG. 2, thereby allowing the passage of a forward current. When a reverse bias is applied to the JBS rectifier, a single depletion layer 24' is formed as is indicated by the one-dot, one-dash lines. This depletion layer 24' prevents the passage of a reverse current.

The JBS rectifier shown in FIG. 2 is basically the same as that JBS rectifier shown in FIG. 1, in both structure and function, but different in that the P+-type silicon areas 18 are spaced from one another by such narrow gaps that they are connected together to reduce the reverse leak current when the reverse bias increases over a small value, for example a few volts.

The N−-type silicon layer 14 has an impurity concentration of, for example, $10^{16}$ atoms/cm$^3$. The P+-type silicon areas 18 are arranged at the intervals of 6 μm. Each P+-type silicon area 18 has a square upper surface contacting the metal film 22, each side being 5 μm long, and has a depth of about 2 μm. When a reverse bias $V_R$ is 0 V, the depletion layers 24 have a thickness of 0.35 μm, and each portion of the N−-type silicon layer 14, which is interposed between the two adjacent P+-type silicon areas 18, has a width of 1 μm.

The JBS rectifier shown in FIG. 2 is identical to the JBS rectifier shown in FIG. 1, except that more P+-type silicon areas 18 contact the barrier metal film 22. In either JBS rectifier, the layer of the Schottky junction defined by the barrier metal film 22 and those portions of the N−-type layer 14 which contact the film 22 is less than the total surface layer of the N−-type layer 14 by the sum of the areas of the P+-type layers 18. As has been pointed out, that portion of the N−-type silicon layer in which a P+-type silicon area is formed has a surface area of 36 μm² (=6×6 μm), and each P+-type silicon area has a surface area of 25 μm² (=5×5 μm). The surface area of each P+-type silicon area is 30.6% of the surface area of the upper surface of that portion of the N−-type silicon layer in which a P+-type silicon area is formed. Therefore the current efficiency of the substrate is not very high for the pellet size of the JBS rectifier.

One of the methods of increasing the current efficiency of the substrate is to reduce the surface areas of the P+-type silicon areas. However, a reduction of the reverse breakdown voltage $V_B$ must be prevented despite the curvature of the PN junction. To maintain a sufficient breakdown voltage $V_B$, a P+-type impurity must be diffused into the N−-type silicon layer to a relatively large depth. When the P+-type impurity is diffused into the N−-type silicon layer, it is also diffused in the horizontal direction, inevitably expanding the surface area of each P+-type silicon area. The surface area of each P+-type silicon area can not be reduced as much as is desired to increase the current efficiency of the substrate.

FIG. 3A represents the cross section of each depletion layer 24 when a reverse bias of 0 V is applied to the JBS rectifier shown in FIG. 2, and FIG. 3B illustrates the distribution of electric charge ρ, the distribution of electric field E, and the distribution of potential φ that are observed in the JBS rectifier when a reverse bias of 0 V is applied to the JBS rectifier. Also, FIG. 4A shows the cross section of each depletion layer 24 when a reverse bias of 3 V is applied to the JBS rectifier, and FIG. 4B illustrates the distribution of electric charge ρ, the distribution of electric field E, and the distribution of potential φ that are observed when a reverse bias of 3 V is applied to the JBS rectifier. In these figures, M designates the Schottky barrier metal film. Plotted on the x-axis in FIG. 3B and 4B is the depth of that portion of the substrate which is located between any two adjacent P+-type silicon areas 18.

As is evident from FIGS. 3A and 3B, a specific charge is accumulated in the surface of the N−-type silicon layer 14 when a reverse bias $V_R$ of 0 V is applied to the JBS rectifier. As is shown in FIGS. 4A and 4B, the distribution of electric charge ρ has a square profile when a reverse bias voltage $V_R$ of 3 V is applied to the JBS rectifier. In this case, the distribution of electric field E and the distribution of potential φ have similar profiles. The maximum intensity $E_m$ of the electric field and the maximum potential $V_d$, both shown in FIG. 4B, are given:

$$E_m = -(qN_dW)/\epsilon_s$$

$$V_d = -(qN_dW^2)/(2\epsilon_s)$$

where $N_d$ is the impurity concentration of the N−-type silicon layer, W is the width of the depletion layer, and $\epsilon_s$ is the dielectric constant of silicon.

As is understood, the profile of electric field (E) distribution has a high gradient. Therefore, the P+-type silicon layer cannot serve to provide an adequate depletion-layer effect. The higher the breakdown voltage the JBS rectifier has, the deeper the P+-type silicon layer must be, and the lower the current efficiency of the substrate.

As has been described, the ordinary Schottky barrier diode, whose forward voltage is low and which operates at high speed, has a low reverse breakdown voltage and a large reverse leakage current. The JBS rectifier, developed to have a high reverse breakdown voltage and a small reverse leakage current, has an N−-type silicon layer which defines a Schottky junction with the barrier metal film and whose surface area is smaller than the area of that portion of the N−-type silicon layer contacting the metal film by the sum of the areas of the P+-type silicon layers. The current efficiency of the substrate is inevitably low because the surface area of the substrate which contacts the barrier metal film is comparatively large. The area at which each P+-type silicon layer contacts the barrier metal film may be reduced to increase the current efficiency, but can not be reduced as much as desired because the reverse breakdown voltage of the JBS rectifier is directly proportional to said area.

The P+-type silicon layers can be arranged at larger intervals thereby to increase the area occupied by the N−-type silicon layer. However, the larger the intervals at which the P+-type silicon layers are arranged, the greater the reverse leakage current.

SUMMARY OF THE INVENTION

It is the object of the present invention to provide a semiconductor device comprising a Schottky barrier diode, wherein a PN junction is formed on a semiconductor layer located below a barrier metal film, the current efficiency of a substrate is high even though the surface area of the substrate which contacts the barrier metal film is comparatively small, and the reverse voltage is not very high when a continuous depletion layer is formed, thereby decreasing reverse leakage currents.

According to the present invention, a semiconductor device comprises: a semiconductor substrate having first and second major surfaces and including a first semiconductor layer of a first conductivity type, a second semiconductor layer of a first conductivity type formed on the first semiconductor layer and having an impurity concentration lower than that of the first semiconductor layer, and a third semiconductor layer formed between the first and the second, set in Schottky contact with the second metal film, and having an impurity concentration lower than that of the first semiconductor layer and lower than that of the second semiconductor layer; first metal film formed on the first major surface of the semiconductor substrate, and contacting the first semiconductor layer; second metal film formed on the second major surface of the semiconductor substrate; and a plurality of semiconductor areas of the second conductivity type, formed in the second major surface of the semiconductor substrate, contacting the second metal film, and extending through the second semiconductor layer and reaching at least the third semiconductor layer.

BRIEF DESCRIPTION OF THE DRAWINGS

The aforementioned aspects and other features of the present invention are explained in the following description, taken in connection with the accompanying drawings, in which:

FIG. 5 is a sectional view showing a semiconductor device according to the present invention;

FIG. 6 is a schematic representation of the substrate of the semiconductor device shown in FIG. 5;

FIGS. 7A and 7B are a sectional view and a plan view, both illustrating the arrangement of the P+-type silicon areas of the device shown in FIG. 5;

DETAILED DESCRIPTION OF THE PREFERRED EMBODIMENTS

Figure 1:
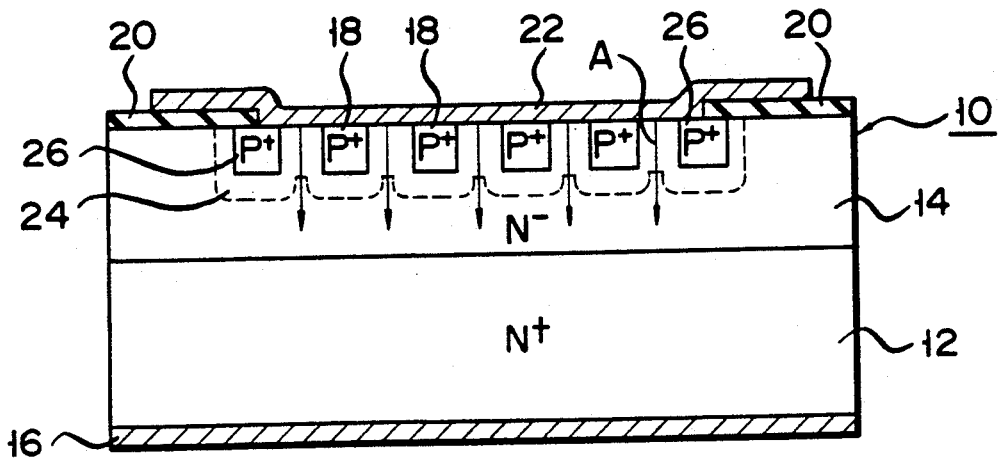
FIG. 1 is a sectional view showing a conventional semiconductor device.
Figure 2:
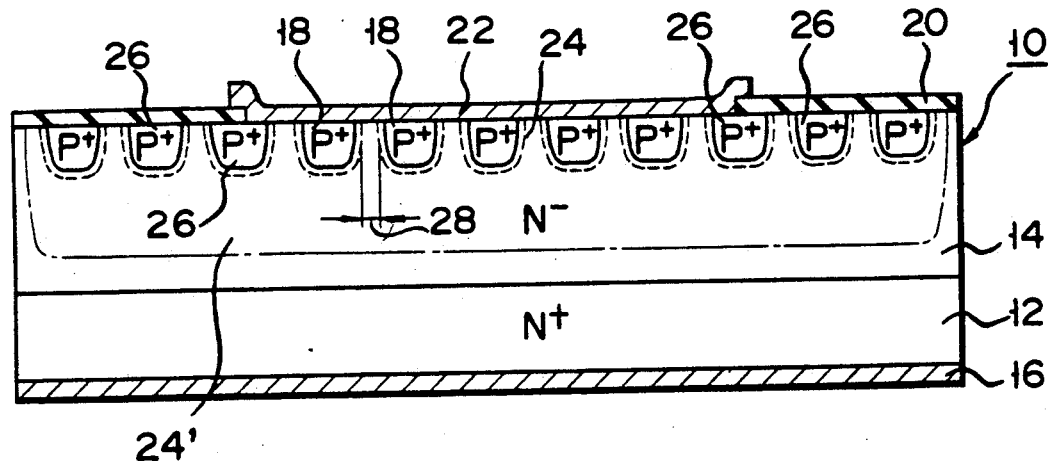
FIG. 2 is a sectional view showing another conventional semiconductor device.
Figure 3A:
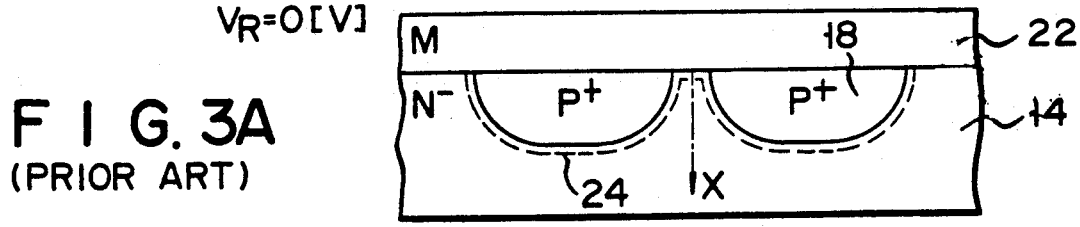
FIGS. 3A and 3B are a schematic view showing the depletion layers formed in the conventional device shown in FIG. 2, and a diagram representing the distribution of electric charge ρ, the distribution of electric field E, and the distribution of potential φ observed in the semiconductor device.
Figure 3B:
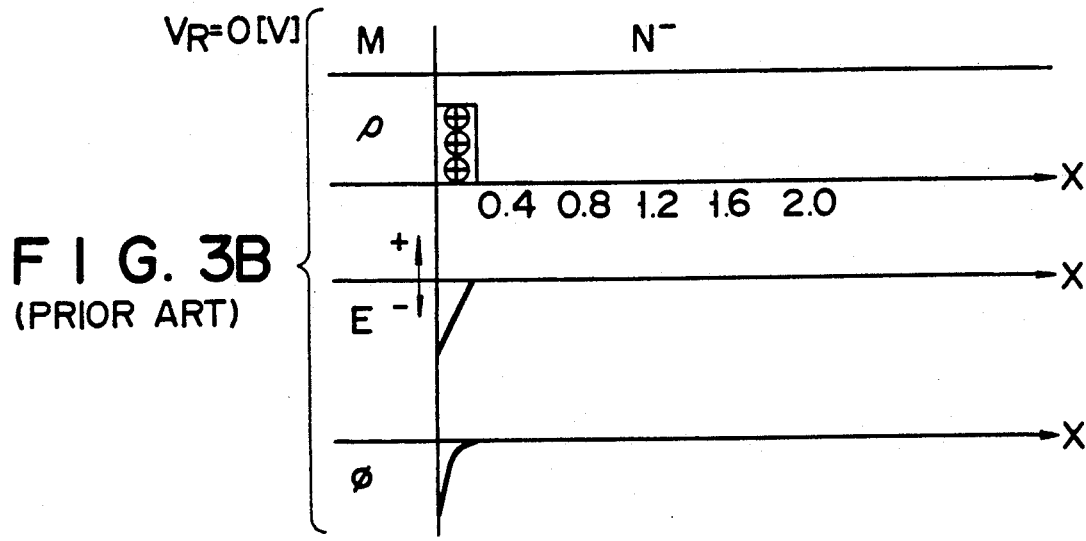

The preferred embodiments of the invention will now be described with reference to the accompanying drawings.

FIG. 5 is a cross-sectional view illustrating a junction barrier-controlled Schottky (JBS) rectifier according to one embodiment of the present invention. The JBS rectifier has a semiconductor layer, cathode electrode film 32 formed on the lower surface of the semiconductor substrate 30, and an anode electrode film 34 formed on the upper surface of a semiconductor substrate 30. The lower surface of the cathode electrode film 32 defines one major surface of the substrate 30, whereas the anode electrode film 34 defines the other major surface of the substrate 30.

As is shown in FIG. 6, the semiconductor layer is comprised of a semiconductor layer 36 (hereinafter called "N+-type layer") of a first conductivity type (i.e., N-type) formed on the cathode electrode film 32, a semiconductor layer 38 (hereinafter called "N−-type layer") of the first conductivity type formed on the N+-type layer 36 and having an impurity concentration (i.e., $10^{16}$ atoms/cm$^3$), a semiconductor layer 40 of the first conductivity type (hereinafter called "N−−-type layer") formed on the N−-type layer 38 and having an impurity concentration (i.e., $10^{14}$ atoms/cm$^3$) lower than that of the N−-type layer 38, and a semiconductor layer 42 of the first conductivity type (hereinafter called "N−-type layer") formed on the N−−-type layer 40 and having an impurity concentration (i.e., $10^{16}$ atoms/cm$^3$). The four silicon layers, i.e., the N+-type layer 36, the N−-type layer 38, the N−−-type layer 40, and the N−-type layer 42 are made of single-crystal silicon.

The anode electrode film 34 is made of a Schottky-barrier metal such as titanium (Ti, Mo, V), and is formed in the opening of an oxide film 44 which is formed on the second major surface of the substrate 30. A plurality of semiconductor areas 46 that of the substrate 30 is formed in the second major surface of the substrate. These areas 46 (hereinafter referred to as "P+-type layers") have a conductivity type opposite that of the substrate 30 and contact the anode electrode film 34 and extend downward through the N−-type film 34 and the N−−-type layer 40 and into the N−−-type layer 38. A guard ring layer 48 (hereinafter called "P+-type layer") is formed in the surface of the substrate 30, surrounding that portion of the substrate 30 in which the P+-type areas 46 are formed. The P+-type layer 48 increases the withstand voltage of the JBS rectifier. A channel stopper layer 50 (hereinafter referred to as "N+-type layer") is also formed in the surface of the substrate 30, surrounding the P+-type layer 48, thereby preventing a depletion layer from expanding in the horizontal direction in the substrate 30. If necessary, a P+-type layer, or a high-voltage termination layer, can be formed in the surface of the substrate 30 and between the p+-type layer 48 and the N+-type layer 50.

The JBS rectifier shown in FIGS. 5 and 6 is manufactured by a known method. As is illustrated in FIG. 6, the N−-type layer 38 having a thickness of 3 to 4 μm is formed on the N+-type layer 36 (i.e., a semiconductor wafer). Then, the N−−-type layer 40 having a thickness of 1 μm is formed on the N−-type layer 38. Next, the N−-type layer 42 having a thickness of 1 μm is formed on the N−−-type layer 40. The layers 38, 40, and 42 are formed by means of epitaxial growth such that they have the impurity concentrations specified above. Alternatively, the layer 42 can be formed by implanting ions of the impurity into the surface of the layer 40. In this case, the layer 40 must be 2 μm thick.

Thereafter, the oxide film 44 is formed on the N−-type layer 42. Phosphorus (P) are implanted into the substrate 30 by a known method, thereby forming the N+-type layer 50. Further, boron (B) are implanted into the substrate 30, thus forming the P+-type areas 46 and the P+-type layer 48. Titanium (Ti, Mo, V) is deposited in the opening of the oxide film 44 by means of sputtering or vapor deposition, and aluminum (Al) is deposited, thereby forming the anode electrode film 34.

As can be understood from the above, the JBS rectifier has a substrate 30 consisting of four semiconductor layers, i.e., the N+-type layer 36, the N−-type layer 38, the N−−-type layer 40, and the N−-type layer 42. It further comprises a plurality of P+-type areas 46 formed in the second major surface of the substrate 30, the areas 46 extending downward through the N−-type layer 42 and the N−−-type layer 40 into the N−-type layer 38.

In operation, a forward bias is applied between the anode electrode film 34 and the cathode electrode film 32. Generally, the voltage that the current begins to flow in an SBD is smaller than that of a PN junction diode. Then, a current flows from the film 34 through the $N^-$-type layer 42, the $N^{--}$-type layer 40, the $N^-$-type layer 38, and the $N^+$-type layer 36. The current finally flows into the cathode electrode film 32. As a result, the forward-voltage drop decreases, and the JBS rectifier exhibits a forward-voltage characteristic very similar to that of the ordinary Schottky-barrier diode.

In FIG. 5, the two-dots, one-dash lines indicate the regions 52 through which currents should flow if no depletion layers were formed in the substrate 30. Actually, a depletion layer is formed in the PN junction of the JBS rectifier. Table 1, which is an excerpt from a publication (i.e., a Si data book), shows the relationship of the impurity concentration of an N-type layer and the width of a depletion layer formed in the N-type layer when the N-type layer forms a step-shaped PN-junction jointly with the height impurity of P-type region. The N-type layer is equivalent to the $N^-$-type layers 38 and 42 and also to the $N^{--}$-type layer 40. The $N^-$-type layers 38 and 42 have an impurity concentration of $10^{16}$ atoms/cm$^3$, whereas the $N^{--}$-type layer 40 has an impurity concentration of $10^{14}$ atoms/cm$^3$. A reverse bias $V_R$ applied to the $N^-$-type layers 38 and 42, and the N-type layer is 0 V, or 40 V whereas a reverse bias $V_R$ applied to the $N^{--}$-type layer 40 is 10 V.

TABLE 1

| Impurity Concentrations of N-type Layers (atoms/cm$^3$) | Widths of Depletion Layers ($\mu$m) | |
| --- | --- | --- |
| | $V_R = 0$ V | $V_R = 10$ V |
| $10^{16}$ | 0.35 | 1 |
| $10^{14}$ | 3.5 | 10 |

As is evident from Table 1, the depletion layer formed in the $N^{--}$-type layer 40 is about ten times wider than the depletion layer formed in the $N^-$-type layers 38 and 42. The locations of the $P^+$-type areas 46 are determined in accordance with the data shown in Table 1 to satisfy two specific conditions. The first condition is that a depletion layer be formed in the $N^{--}$-type layer 40 when a low reverse bias (including 0 V) is applied to the JBS rectifier such that it pinches off the current path and that the current path is not pinched off when a forward bias is applied. The second condition is that the area in which the anode electrode film 34 contacts the $N^-$-type layer 42, thus defining a Schottky contact, is much greater than the contact area between the $P^+$-type area 46 and the substrate 30.

Further, the $P^+$-type area 46 is formed such that the depletion layers formed in the substrate 30 when a forward bias is applied are not connected to one another to pinch off the path of the forward current, and also that the depletion layers formed in the substrate 30 when a reverse bias is applied are connected to one another to pinch off the path of the reverse leakage current.

FIGS. 7A and 7B are views illustrating the arrangement of the $P^+$-type areas 46. As is shown in these figures, the upper surface of each $P^+$-type area 46 is a square whose sides have a length $l_1$. The areas 46 are spaced apart from one another for a distance of $l_2$. In this embodiment, $l_1$ and $l_2$ are, for example, 5 $\mu$m and 10 $\mu$m, respectively. The areas 46 have a depth of about 2 $\mu$m. When a reverse bias $V_R$ of 0 V is applied to the JBS rectifier, a depletion layer having a thickness of 3.5 $\mu$m will be formed around each $P^+$-type area 46. In this case, that portion of the $N^-$-type layer 42 which is located between any two adjacent $P^+$-type areas 46 will have a width of 5 $\mu$m.

The region allotted to each area 46 has an area of is 100 $\mu$m$^2$ ($=10$ $\mu$m$\times 10$ $\mu$m). Of this area, 25 $\mu$m$^2$ is occupied by the area 46. Hence, the area in which the $N^-$-type layer 42 contacts the anode electrode film 34 is 75% of the area of the region allotted to each area 46. This value of 75% is much greater than in the conventional JBS rectifier, and the substrate 30 has a current efficiency much higher than that of the substrate of the conventional JBS rectifier.

When the reverse bias is applied between the anode electrode film 34 and the cathode electrode film 32, the PN junction located between each $P^+$-type area 46 and the $N^{--}$-type layer 40 is reverse-biased, and a depletion layer develops and expands into the $N^{--}$-type layer 40 which as a low impurity concentration. Finally, the depletion layers formed in the layer 40 contact one another, forming a single depletion layer. This depletion layer pinches off the current path, thereby decreasing the reverse leakage current. Therefore, the JBS rectifier has a reverse-current characteristic which is extremely similar to that of the ordinary junction diode.

The reverse bias voltage for pinching off the current path should be as low as possible, in order to improve the reverse-current characteristic of the JBS rectifier. As has been pointed out, the $N^{--}$-type layer 40 has a low impurity concentration, so that the current path is pinched off when a low reverse bias including 0 V is applied between the anode electrode film 34 and the cathode electrode film 32. On the other hand, the $N^-$-type layers 42 have an impurity concentration higher than that of the $N^{--}$-type layer 40, so that a desired Schottky barrier is formed to allow only a relatively small forward voltage drop. In other words, the $N^{--}$-type layer 40 having a low impurity concentration serves to pinch off the current path, whereas the $N^-$-type layers 42 serve to form a desired Schottky, barrier. Any two adjacent $P^+$-type areas 46 can have a wide gap in the N-layer so the current path need not be pinched off when the reverse bias is applied to the JBS rectifier. Since the gap between any two adjacent $P^+$-type areas 46 is wide, that surface area of each $N^-$-type layer 42 which forms a Schottky junction is sufficiently large.

Figure 8:
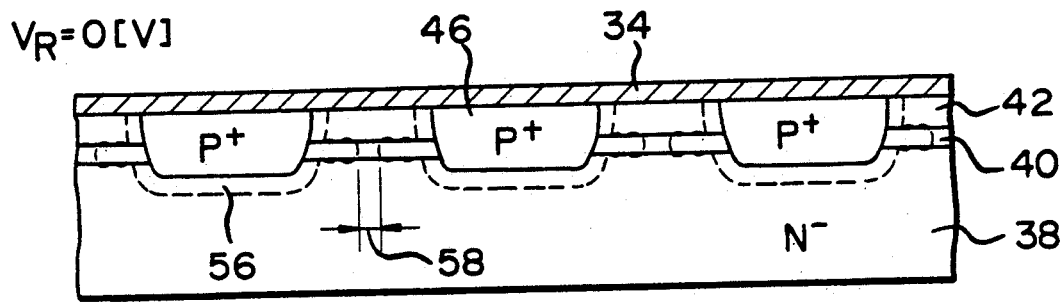
FIG. 8 is a sectional view showing the depletion layers which are formed in the device illustrated in FIG. 5 when a reverse bias $V_R$ of 0 V is applied to the device.
Figure 9:
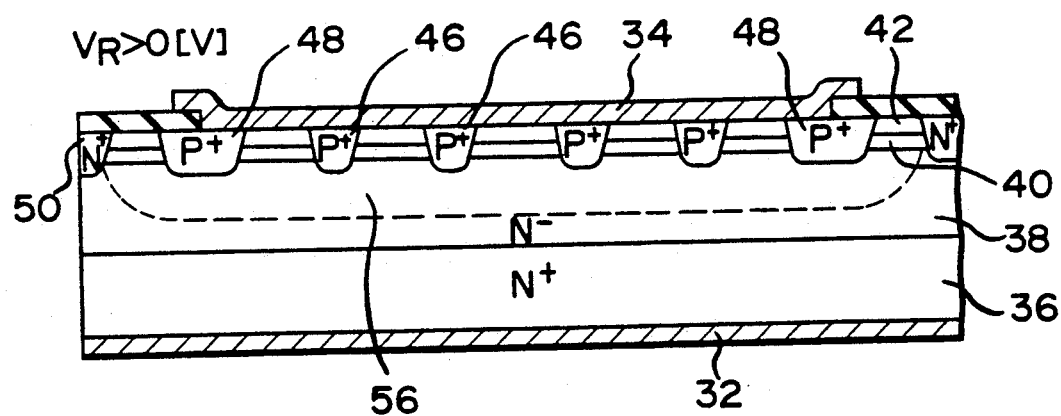
FIG. 9 is a sectional view showing a depletion layer which is formed in the device illustrated in FIG. 5 when a reverse bias $V_R$ of a value greater than 0 V is applied to the semiconductor device.

FIG. 8 is a diagram showing the depletion layers 56 which are formed when a reverse bias $V_R$ of 0 V is applied to the JBS rectifier (FIG. 5). FIG. 9 is a diagram illustrating the depletion layer 56 which is formed when a reverse bias $V_R$ higher than 0 V is applied to the JBS rectifier (FIG. 5).

In the case shown in FIG. 8, that portion 58 of the layer 40, located between the two depletion layers 56 formed around any adjacent $P^+$-type areas 46, serves as a current path. This current path (i.e., the portion 58) expands when a forward bias is applied to the JBS rectifier, and a forward current thereby flows, the substrate therefore has a high current efficiency, and the JBS rectifier exhibits a forward-current characteristic extremely similar to that of the conventional SBD rectifier. If the current path (i.e., the portion 58) is formed when forward bias is applied to the JBS rectifier. The depletion layers 56 can expand throughout the $N^{--}$-type layer 40, thus forming a single depletion layer. Even in this case, current paths are secured since the $N^-$-type layer 42 has some portions in which no depletion layers are formed.

In the case shown in FIG. 9, a single depletion layer 56 is formed in the layers 38, 40, and 42 since the reverse bias $V_R$ is higher than 0 V. The depletion layer pinches off the current paths. As a result, the increase of the reverse leakage current decreases because of the Schottky junction. The reverse-current characteristic of the JBS rectifier is improved, becoming very similar to the reverse leakage-current characteristic of the ordinary PN-junction diode.

In the embodiment shown in FIG. 5, the P+-type areas 46 can be formed in the layers 42 and 40 only, and may not extend into the N--type layer 38. Also, the P+-type areas 46 can take a shape different from that shown in FIGS. 7A and 7B. Furthermore, the substrate 30, which consists of four layers 36, 38, 40 and 42, can be replaced by one which consists of three layers, e.g., an N+-type layer, an N---type layer formed on the N+-type layer, and an N--type layer formed on the N---type layer. If this is the case, the areas 46 can be formed through the N--type layer and in the N--type layer, whereby the same advantages are achieved as by the substrate 30 comprised of the four layers 36, 38, 40, and 42.

Generally, the lower the impurity concentration of a semiconductor layer contacting a Schottky-barrier metal film, the higher the Schottky barrier is formed in the semiconductor layer. Hence, a Schottky barrier formed in an N---type layer contacting a barrier metal film is higher than a Schottky barrier formed in an N--type layer, and causes a greater forward voltage drop. Therefore, when the substrate 30 is comprised of an N+-type layer, an N--type layer on the N+-type layer, and an N---type layer on the N--type layer, the depletion layer is thin, and the electric field within the depletion layer has a high gradient. Consequently, the depletion layer cannot withstand a high reverse voltage. In other words, so-called the barrier effect of the depletion layer decreases. However, this problem does not arise if the substrate includes a N--type layer directly adjacent the anode metal film. The problem does not arise in the JBS rectifier shown in FIG. 5, wherein the N--type layer 42 contacts the anode electrode film 34.

Figure 10A:
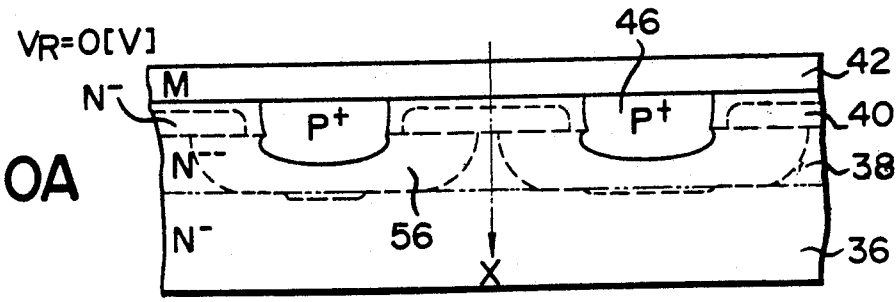
FIGS. 10A and 10B are a schematic view illustrating the depletion layers formed in the device shown in FIG. 5, and a diagram representing the distribution of electric charge ρ, the distribution of electric field E, and the distribution of potential φ observed in the device.
Figure 10B:
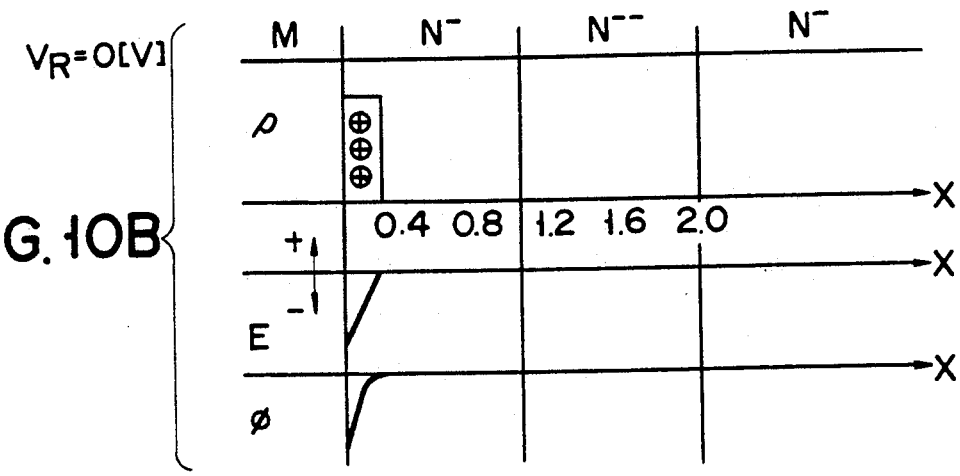
Figure 11A:
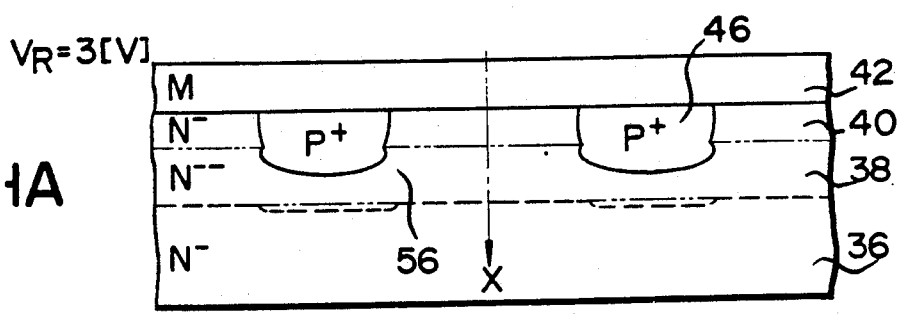
FIGS. 11A and 11B are respectively a schematic view showing the depletion layers formed in the device shown in FIG. 5 under different conditions (FIGS. 10A and 10B), and a diagram representing the distribution of electric charge ρ, the distribution of electric field E, and the distribution of potential φ observed in the device under the different conditions.
Figure 11B:
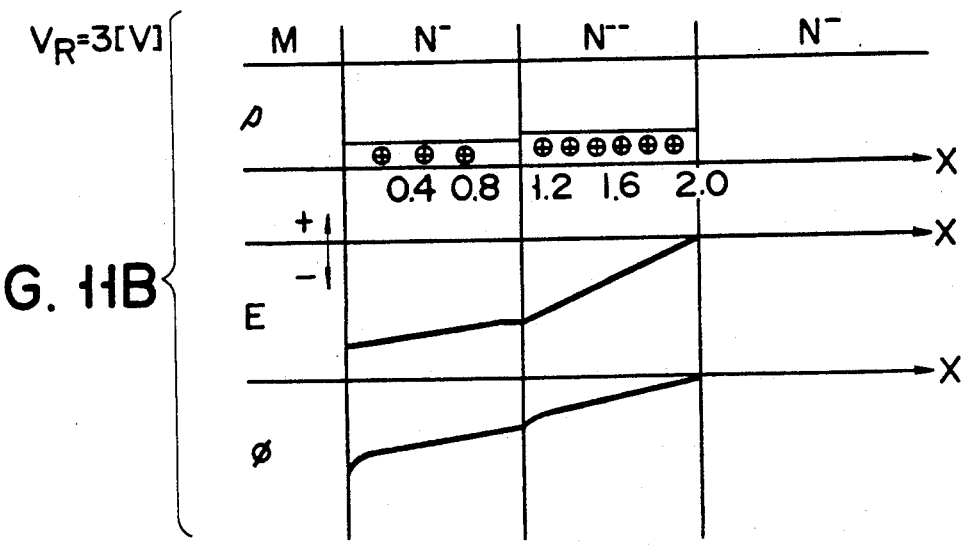

FIGS. 10A and 10B are a schematic view showing the depletion layers formed in the JBS rectifier when a reverse voltage of 0 V is applied to the rectifier, and a diagram representing the distribution of electric charge ρ, the distribution of electric field E and the distribution of potential φ when a reverse bias of 0 V is applied to the JBS rectifier. On the other hand, FIGS. 11A and 11B are a schematic view showing the depletion layers formed in the JBS rectifier when a reverse bias of 3 V is applied to the JBS rectifier, and a diagram representing the distribution of electric charge ρ, the distribution of electric field E and the distribution of potential φ when a reverse bias of 3 V is applied to the JBS rectifier. In FIGS. 10A, 10B, 11A and 11B, M designates the Schottky-barrier metal film. The thickness of that portion of the substrate 30 which is located between any two adjacent P+-type areas 46 is plotted on x axis in FIGS. 10B and 11B.

Figure 4A:
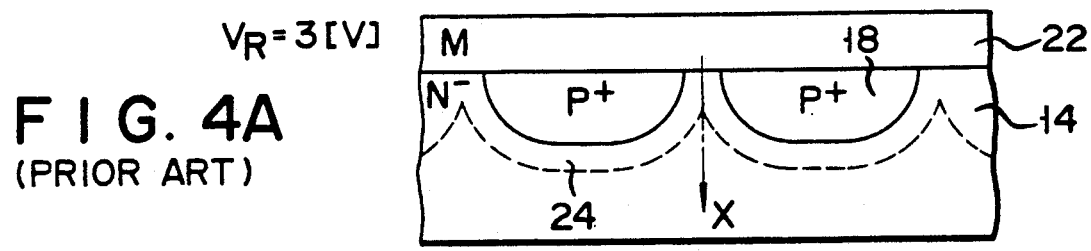
FIGS. 4A and 4B are respectively a schematic view showing the depletion layer formed in the conventional device shown in FIG. 2 under different conditions (FIGS. 3A and 3B), and a diagram representing the distribution of electric charge ρ, the distribution of electric field E, and the distribution of potential φ observed in the device under the different conditions.
Figure 4B:
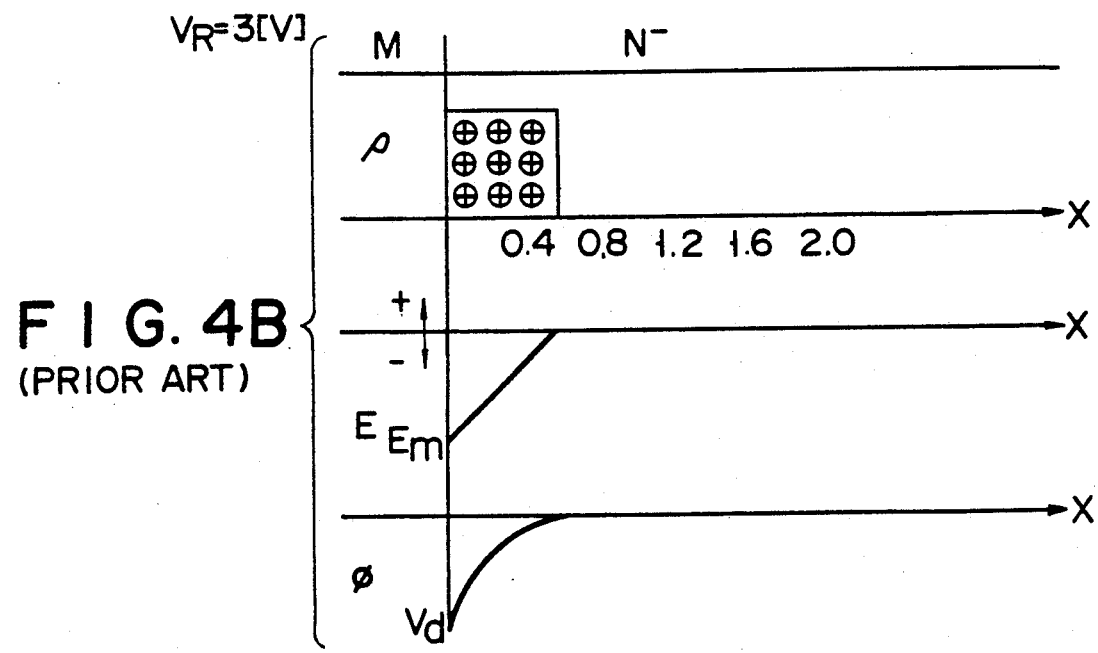

As is evident from FIGS. 10A and 10B, a specific amount of electrical charge is accumulated in the surface of the N--type layer 42 when a reverse bias of 0 V is applied to the JBS rectifier. In contrast, as is evident from FIGS. 11A and 11B, an electrical charge is dispersed through the N--type layer 42 into the N---type layer 40 when a reverse bias of 3 V is applied to the JBS rectifier. Thus, the profile of charge-distribution extends horizontally, whereby the distributions of electric field and potential have lower gradients than those in the conventional device (FIG. 4B). The depletion layers formed around the P+-type areas improve the reverse-current characteristic of the JBS rectifier.

As has been described, in the JBS rectifier according to the present invention, a desired Schottky barrier is formed in the N--type layer contacting the Schottky-barrier metal film, and the N---type layer serves to pinch off the current path when a reverse bias is applied to the JBS rectifier. Therefore, the area occupied by those portions of the N--type layer which contact the Schottky-barrier metal film increases, and the JBS rectifier has a high current efficiency for its pellet size and an improved reverse-current characteristic.

What is claimed is:

1. A semiconductor device comprising:
   a semiconductor substrate having first and second major surfaces, and comprising:
   a first semiconductor layer of a first conductivity type;
   a second semiconductor layer of said first conductivity type having an impurity concentration lower than that of the first semiconductor layer; and
   a third semiconductor layer formed on said second semiconductor layer in Schottky contact with a second metal film having an impurity concentration lower than that of said first semiconductor layer and higher than that of the second conductor layer;
   a first metal film formed on the first major surface of said semiconductor substrate, and contacting said first semiconductor layer;
   a second metal film formed on the second major surface of said semiconductor substrate; and
   a plurality of fourth semiconductor layers of a second conductivity type, formed in the second major surface of said semiconductor substrate, contacting said second metal film, and extending through said third semiconductor layer and reaching at least said second semiconductor layer.

2. A device according to claim 1, wherein said fourth semiconductor layers of the second conductivity type are located such that discrete depletion layers are formed around the respective fourth semiconductor layers of the second conductivity type when a forward bias is applied to said semiconductor substrate, and a continuous depletion layer contacting the semiconductor layers of the second conductivity type is formed when a reverse bias is applied to said semiconductor substrate.

3. A device according to claim 1, further comprising a fifth semiconductor layer of the first conductivity type interposed between said first and second semiconductor layers and having an impurity concentration lower than that of said first semiconductor layer and higher than that of said second semiconductor layer.

4. A device according to claim 3, wherein the impurity concentrations of said third and fourth semiconductor layers are at most $10^{16}$ atoms/cm$^3$ and the impurity concentration of said second semiconductor layer is at most $10^{14}$ atoms/cm$^3$.

5. A device according to claim 3, wherein said second and third semiconductor layers have a thickness of about 1 μm, and said fifth semiconductor layer has a thickness of about 3 to 4 μm.

6. A device according to claim 1, wherein the sides of each of said fourth semiconductor layers has a length less than the distance said fourth semiconductor layers are spaced apart from each other.

7. A device according to claim 1, wherein the first conductivity type is N type, and the second conductivity type is P type.

8. A device according to claim 7, wherein said first semiconductor layer is made of N+-type silicon, said second semiconductor layer is made of N⁻⁻-type silicon, said third semiconductor layer is made of N⁻-type silicon, and said fourth semiconductor layers of the second conductivity type are made of P+-type silicon.

9. A device according to claim 1, further comprising guard ring means formed in the second major surface of said semiconductor substrate and surrounding said fourth semiconductor layers of the second conductivity type.

10. A device according to claim 1, wherein said first metal film is a cathode electrode, and said second metal film is an anode electrode.

* * * * *